(12) United States Patent  
Blyth et al.

(10) Patent No.: US 7,554,843 B1
(45) Date of Patent: Jun. 30, 2009

(54) SERIAL BUS INCORPORATING HIGH VOLTAGE PROGRAMMING SIGNALS

(75) Inventors: Trevor A. Blyth, Sandy, UT (US); Richard V. Orlando, Los Gatos, CA (US)

(73) Assignee: Alta Analog, Inc., San Jose, CA (US)

( * ) Notice: Subject to any disclaimer, the term of this patent is extended or adjusted under 35 U.S.C. 154(b) by 233 days.

(21) Appl. No.: 11/267,460

(22) Filed: Nov. 4, 2005

(51) Int. Cl.
*G11C 11/34* (2006.01)

(52) U.S. Cl. .................. 365/185.03; 365/185.05; 365/185.18; 365/185.19; 365/185.29; 365/185.33; 365/226

(58) Field of Classification Search ............ 365/185.06, 365/185.24, 185.28, 185.29, 185.33, 158, 365/226, 185.03, 185.23, 189.02, 189.11, 365/230.02, 185.18, 185.05, 185.19
See application file for complete search history.

(56) References Cited

U.S. PATENT DOCUMENTS

| | | | | |
|---|---|---|---|---|
| 5,301,161 A | * | 4/1994 | Landgraf et al. | 365/185.33 |
| 5,467,307 A | * | 11/1995 | D'Arrigo et al. | 365/185.06 |
| 5,532,962 A | * | 7/1996 | Auclair et al. | 365/185.24 |
| 5,557,569 A | * | 9/1996 | Smayling et al. | 365/185.33 |
| 5,694,360 A | * | 12/1997 | Iizuka et al. | 365/185.33 |
| 5,828,607 A | * | 10/1998 | Bushey et al. | 365/226 |
| 6,023,427 A | * | 2/2000 | Lakhani et al. | 365/185.33 |
| 6,108,262 A | * | 8/2000 | Itoh et al. | 365/189.11 |
| 6,166,969 A | * | 12/2000 | Song et al. | 365/189.11 |
| 6,169,687 B1 | * | 1/2001 | Johnson | 365/158 |
| 6,249,458 B1 | * | 6/2001 | Shokouhi et al. | 365/189.11 |
| 6,269,029 B1 | * | 7/2001 | Suh | 365/189.11 |
| 6,304,495 B1 | * | 10/2001 | Kim et al. | 365/189.11 |
| 6,373,773 B2 | * | 4/2002 | Sumimoto | 365/226 |
| 6,721,212 B2 | * | 4/2004 | Sasaki | 365/189.11 |
| 6,807,116 B2 | * | 10/2004 | Yamazaki et al. | 365/189.11 |
| 6,813,185 B2 | * | 11/2004 | Kobayashi et al. | 365/185.11 |
| 6,826,107 B2 | * | 11/2004 | Dvir et al. | 365/226 |
| 6,937,496 B2 | * | 8/2005 | Mizuno et al. | 365/226 |
| 6,947,332 B2 | * | 9/2005 | Wallace et al. | 365/185.33 |
| 6,947,347 B2 | * | 9/2005 | Fujioka | 365/185.33 |
| 6,957,135 B2 | * | 10/2005 | Okada et al. | 365/185.33 |
| 6,963,501 B2 | * | 11/2005 | Shiga | 365/185.03 |
| 6,972,977 B1 | * | 12/2005 | Urabe | 365/185.33 |
| 7,120,061 B2 | * | 10/2006 | Daga | 365/185.18 |
| 7,209,252 B2 | * | 4/2007 | Owens et al. | 365/185.33 |
| 7,230,852 B2 | * | 6/2007 | Mitani et al. | 365/185.33 |
| 7,243,185 B2 | * | 7/2007 | See et al. | 365/185.33 |
| 7,243,856 B2 | * | 7/2007 | Agami et al. | 365/185.33 |
| 7,254,083 B2 | * | 8/2007 | Beckert et al. | 365/185.33 |
| 7,259,997 B2 | * | 8/2007 | You | 365/185.33 |
| 7,266,017 B2 | * | 9/2007 | Harari et al. | 365/185.33 |
| 7,415,680 B2 | * | 8/2008 | Hoberman et al. | 716/1 |

\* cited by examiner

*Primary Examiner*—Trong Phan
(74) *Attorney, Agent, or Firm*—Fernandez & Associates, LLP

(57) ABSTRACT

A serial bus which comprises two wires (a clock signal and a data signal), one of which transmits high voltages in addition to the two-level voltages used for conventional serial digital data transmission. During the second part of the transmission one of the serial wires changes function to a high voltage signal that is used to program the location which was addressed in the first part of the transmission. The high voltage signal may be a simple DC level for programming digital data into memory, or it can be a set of pulses with either fixed or variable parameters for programming digital, multi-level or analog levels into memory.

26 Claims, 7 Drawing Sheets

SERIAL BUS INCORPORATING HIGH VOLTAGE PROGRAMMING SIGNALS

FIELD OF THE INVENTION

The invention relates generally to the field of electronic circuits, and more particularly to serial data communication and the programming of non-volatile memory circuits.

DESCRIPTION OF RELATED ART

Generally speaking, data communication between electronic components and sub-assemblies within an electronic system can be in either a parallel or a serial format. While serial communication has lower data rates or bandwidth compared to parallel systems, the main advantage of serial communication is the reduced number of wires and connection terminals. This results in smaller packages, fewer tracks on a printed circuit board and therefore reduced board area.

There are several different serial data communication protocols. One example is described in U.S. Pat. No. 4,689,740, a "Two-wire bus-system comprising a clock wire and a data wire for interconnecting a number of stations"; generally known as the IIC (Inter-Integrated Circuit) bus. The IIC bus has two signals—a clock signal and a bi-directional data signal. Another protocol is the SPI (Serial Peripheral Interface), as described in the Motorola M68HC11 Reference Manual, 1988 Section 8. The SPI bus has four signals—slave select, clock, and two unidirectional data lines. In certain circumstances the two data lines may be connected to make a single bidirectional data line, thus reducing the number of wires to three. A common characteristic of both the IIC and the SPI bus is that communication between bus locations is via digital data and the signal levels correspond to either a logic "0" or a logic "1".

In a system that includes a non-volatile memory (NVM) it is customary to use high voltages when writing data into the NVM. Some types of memory generate the high voltages internally and therefore do not need an external high voltage source. Other types of memory achieve reduced complexity and reduced die size by eliminating the internal high voltage generation circuits and use an external voltage source. In this case an extra interface wire is needed to connect the external source, as well as an extra pin on the memory package—a major disadvantage in a system which uses a serial bus to minimize connections.

FIG. 1 shows an example of a prior art system that has a serial bus interface logic 140 to a non-volatile memory 170 and an extra connection 130 for an external high voltage source VPP. Connections SDA 110 and SCL 120 are the Serial Data and Serial Clock connections, respectively. Bus Interface Logic 140 block provides the Data 150, Control 160 and synchronization of the serial interface. Digital data on the SDA pin 110 is shifted into or out of the system, under control of the SCL pin 120. While shifting data, the SDA pin changes state during one specific state of SCL 120, say the logic "0" state. If the SDA pin changes state during the opposite state of SCL 120, say the logic "1" state, this is interpreted as a START or a STOP command, depending on whether SDA 110 is changing from high to low or low to high. Steady state voltage levels on both pins are predefined levels that correspond to logic "0" or logic "1" levels. Also shown in FIG. 1 is a VPP pin 130 that connects an external high voltage source to the NVM 170. VPP may be a fixed DC voltage or a set of one or more pulses, usually of fixed amplitude, that is applied when data is to be written into the NVM 170.

The present invention relates to systems in which communication is via a serial bus and in which a location on the serial bus requires high voltages, such as for programming a NVM. There exists a need for a serial bus that requires a reduced number of total wires in the interface.

SUMMARY OF THE INVENTION

The invention discloses a serial bus which comprises two wires (a clock signal and a data signal), one of which transmits high voltages in addition to the two-level voltages used for conventional serial digital data transmission. One of the wires is coupled to and sends a clock signal while the other wire is coupled to and sends a data signal. A high voltage signal can be transmitted in addition to either of these signals on either wire to couple to the location requiring a high voltage.

A serial communication is divided into two parts. The first part is a conventional data stream in which the data and clock signals transmit digital data using two voltage levels that correspond to logic "0" and "1" levels. Transmission during this first part typically comprises a reset, a command, an address and a data stream, or a combination of these. During the second part of the transmission one of the serial wires changes function to transmit a high voltage signal that is used to program the location requiring high voltages, such as a NVM, which was addressed in the first part of the transmission.

In one embodiment, the high voltage signal is used to program data into a non-volatile memory. In this embodiment, the high voltage signal may be a simple DC level for programming digital data into memory, or it may be a set of pulses with either fixed or variable parameters for programming digital, multi-level or analog levels into memory.

One technique that allows analog voltages to be programmed into the NVM, in one embodiment of the invention, requires the output of the analog memory to be read after a program pulse. A decision is then made whether to apply another program pulse and which parameters or characteristics of the pulse should be changed, if any. The decision-making circuits and the pulse shaping circuits may be included on-chip, on the same integrated circuit as the NVM, or may be placed off-chip to minimize complexity and die area of the NVM. In the latter case, where the pulse-shaping is performed off-chip, it is necessary to connect the output voltage, as read from the analog memory, to the external pulse-shaping circuits. A dedicated wire may be added to provide this connection or, alternatively, the analog voltage may be multiplexed onto one of the existing serial bus wires.

Another embodiment couples high voltage pulses of fixed parameters or a D.C. voltage onto the interface. Programming of multi-level or analog values is performed by on-chip shaping of the pulses actually applied to the NVM memory cells.

DETAILED DESCRIPTION OF PREFERRED EMBODIMENTS

Figure 1:
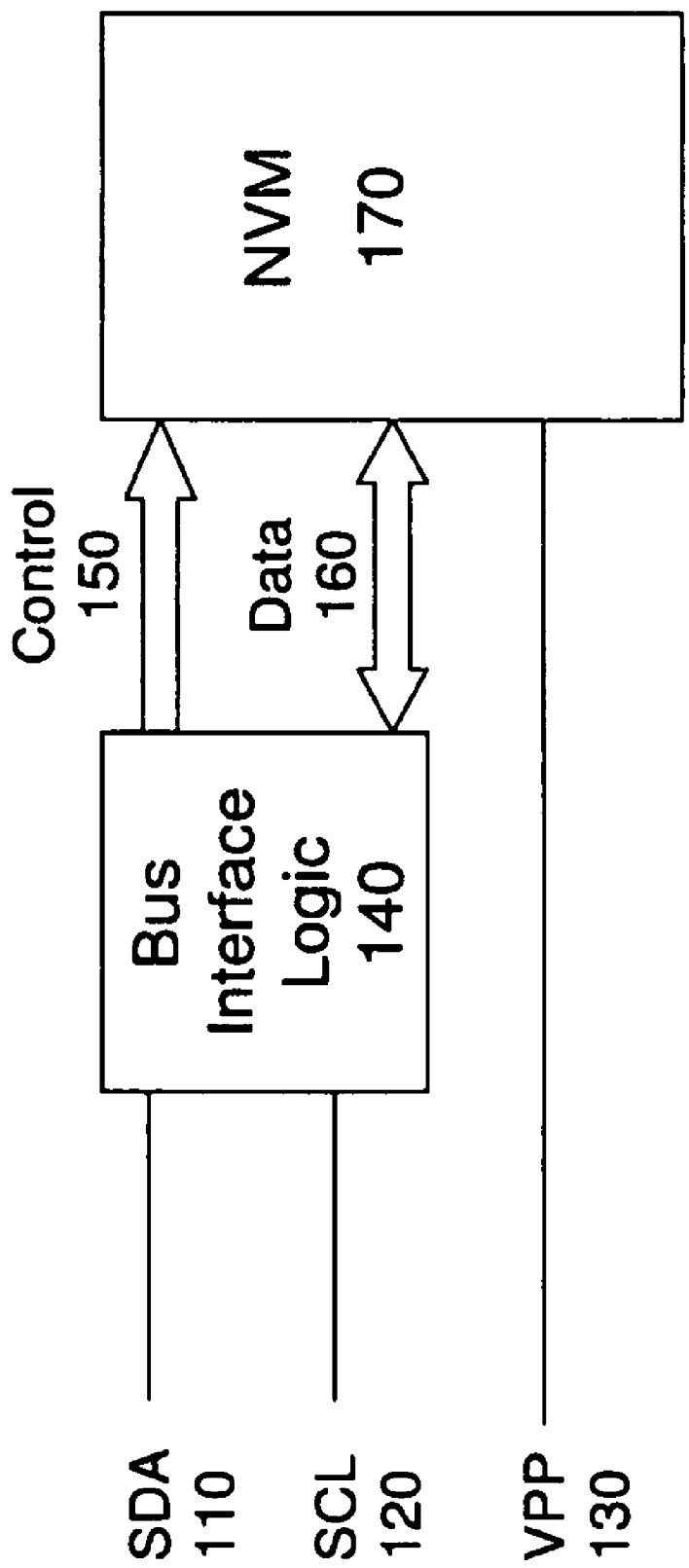
FIG. 1 is a schematic diagram of a prior art system that has a serial interface and a connection to an external high voltage source.
Figure 2:
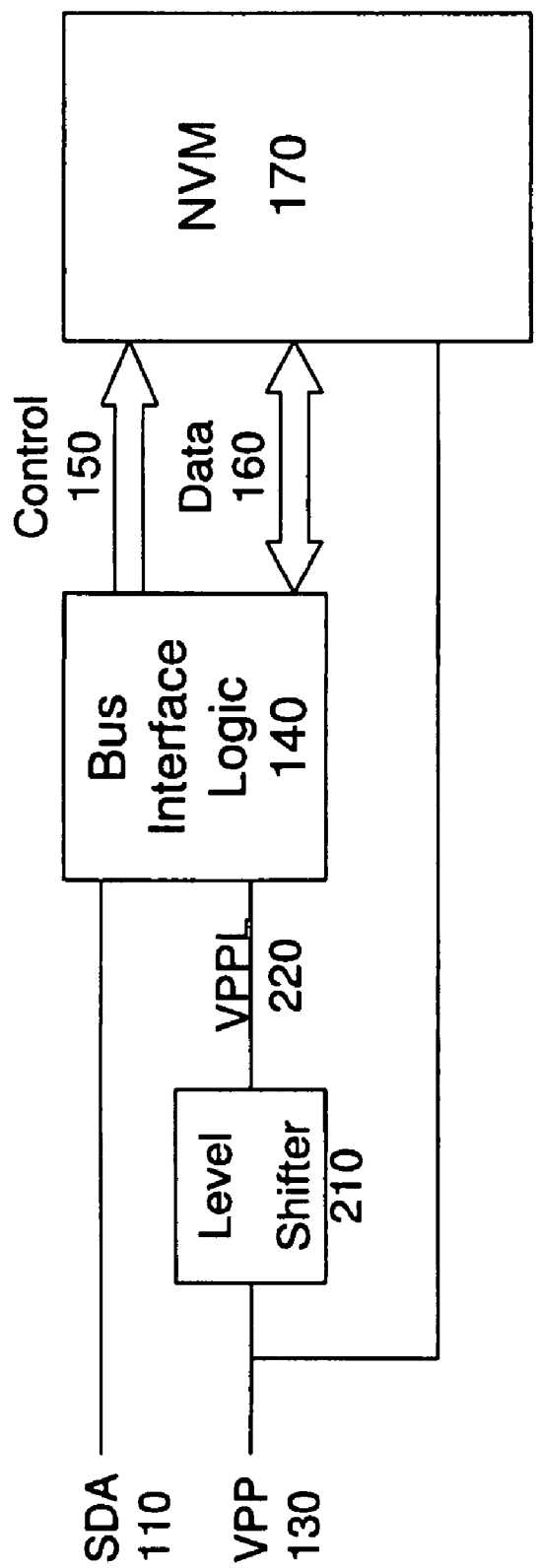
FIG. 2 is a schematic diagram of a system with a serial bus which also supplies high voltages for programming a NVM.

A schematic of the first embodiment of the present invention is shown in FIG. 2. Input pin VPP 130 connects to the input of a level shifter 210. The level shifter creates the logic level signal, VPPL 220. SDA 110 is a logic level signal connected to an input of the Bus Interface Logic block 140 and, together with VPPL 220, provides the Data 160, Control 150 and synchronization of the serial interface. VPP 130 is also connected to one or more locations on the serial bus requiring high voltages and supplies the required high voltages. In one embodiment, VPP 130 is also connected into the non-volatile memory (NVM) 170 and supplies the high voltages required for the writing of data.

It$_{[DFT]}$ is understood that in certain embodiments, the functions of the Bus Interface Logic as described herein may be performed by a CPU, such as in a microcontroller or embedded circuit.

Figure 3:
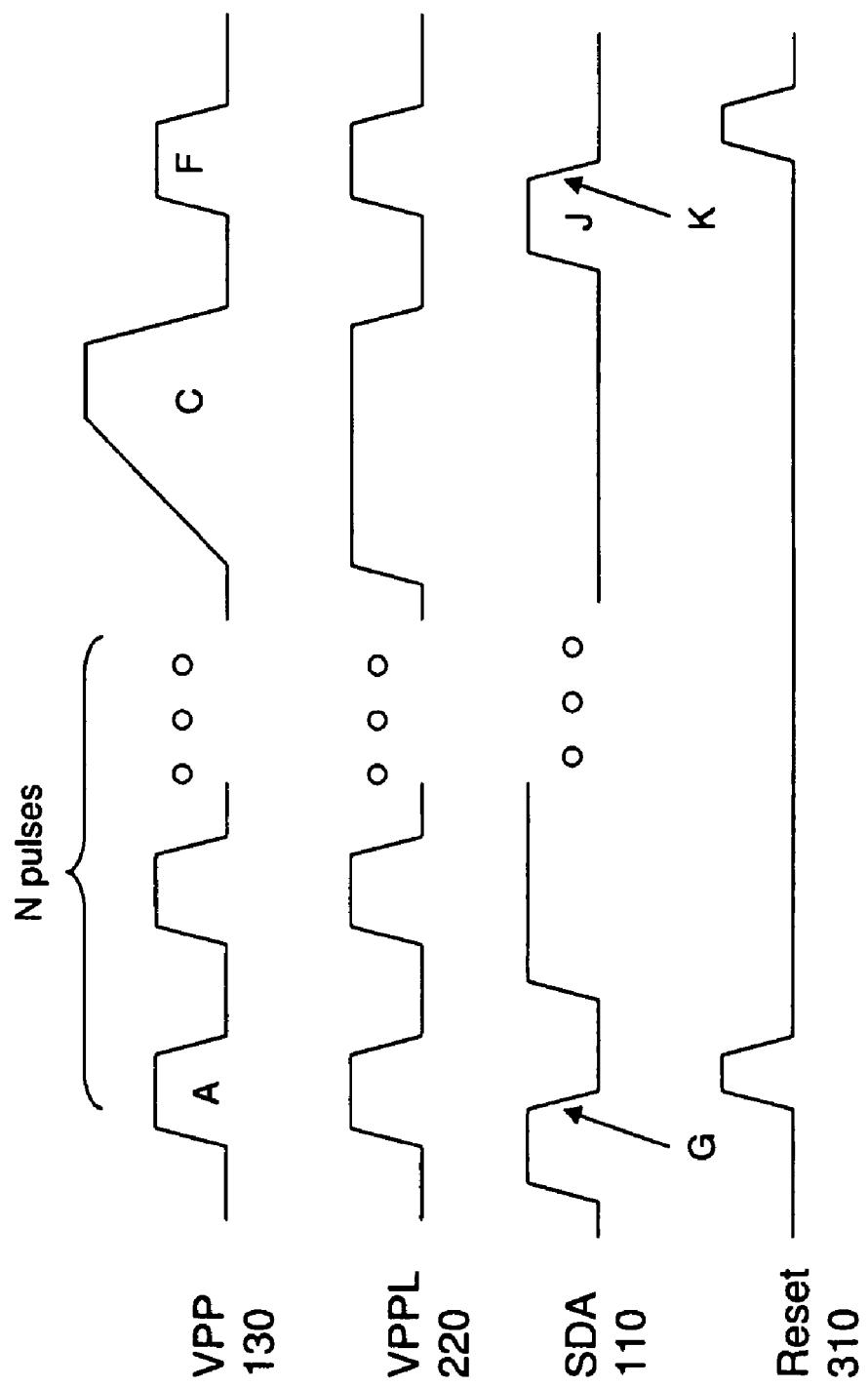
FIG. 3 is a diagram of voltage waveforms applied to SDA and VPP pins for programming digital data.

An example of a serial communication in one embodiment of the invention is shown in the voltage waveform diagram of FIG. 3. The first part of the communication comprises N pulses on VPP, during which time the voltage levels are logic levels. VPP functions as a clock input and clocks the data appearing on SDA into the Bus Interface. The first VPP pulse, A, works in conjunction with SDA to produce a RESET 310. In one embodiment, the SDA falling edge, G, that occurs while VPP is high, sets the RESET signal high. RESET returns to "0" at the next low level on VPP and VPPL. The reset pulse initializes the Bus Interface logic and prepares the logic to receive the input data that is present on the SDA pin during the remaining N−1 logic pulses. The input data, clocked into the Bus Interface Logic by VPPL, can comprise of commands, addresses and data in any combination, as is well known in the art.

Pulse C, which follows the first part of the communication, is a high voltage pulse that is used within the NVM to either program or erase a bit or a group of bits, depending on the command, address and data that was present during the first part of the communication. The parameters of pulse C can be chosen to satisfy the needs of the particular technology used to implement the NVM. For instance, the pulse required for a memory operation that makes use of Fowler-Nordheim tunneling is generally a high voltage pulse (say 14V) of fairly long duration (say 2 milliseconds) and should have a relatively slow ramp up time (say 0.5 milliseconds) to achieve optimum endurance. Fowler-Nordheim tunneling is used during the erase of typical Flash memories and used during both erase and program of EEPROM memories. In contrast, a write operation that makes use of Channel Hot Electron injection (CHE) would typically use a pulse which is shorter in duration (say 10 microseconds), with faster rise time (2 microseconds) and lower voltage amplitude (say 9V). CHE is used to program many types of Flash memory. In another embodiment, a write operation that makes use of Channel Initiated Secondary Electron injection (CHISEL) may be used. The specified voltages and times are typical values for non-volatile memories employing 0.25 um feature sizes. The specified values are for illustrative purposes and can be modified according to the technology used for the NVM.

In another embodiment, a Vpp input can be a D.C. level or pulses with default characteristics. Pulse shaping is performed on-chip to create the required programming conditions for the desired writing operation.

A single high voltage pulse C is shown in FIG. 3, as would be adequate for programming a single word of digital memory bits (such as 8 or 16 bits). However, if the NVM uses an iterative write technique such as erase verify or program verify, or if data is written in multiple subsets, then multiple pulses can also be sent along the serial bus. The falling edge K of pulse J on SDA, in conjunction with pulse F on VPP, creates a RESET which initializes the Bus Interface into a safe condition. Pulses F and J are optional. However, if they are omitted, it is important that the next serial communication begins with a RESET to ensure proper synchronization.

In an alternative embodiment, the high voltage for programming may be provided by SDA instead of VPP. In this case SDA would be connected to both the input of the level shifter and the NVM; VPP would connect directly into the Bus Interface Logic and perform the clocking function only.

In addition, supplying any location on a serial bus with a different voltage from that of the logic level of the serial bus using the above described method is considered within the scope of the invention. Such locations comprise other types of memory, devices, cards, cables, displays and other peripherals.

In a further embodiment of the invention, where a location requires a lower voltage rather than a higher voltage than the logic level, the pulses during the second part of any erase or programming communication may be low voltage. In such an embodiment, a switching device may be added to the serial interface to prevent damage to such a location requiring low voltage during the first part of the communication, which is at the logic level.

It is further understood that where one or more devices requiring a non-logic voltage level are located on the same bus interface, a multiplexer or switching device may be used to implement sending the voltage pulses to the individual devices as required.

Figure 4:
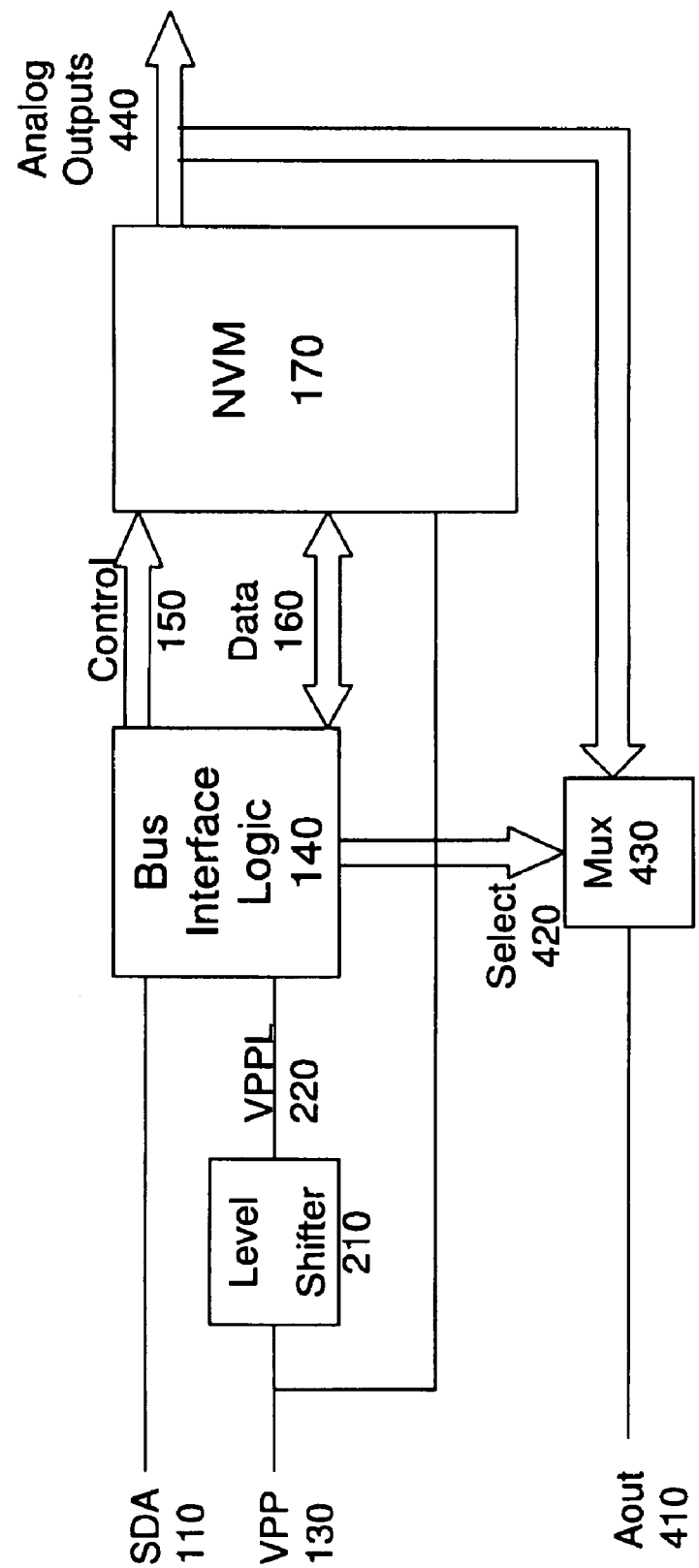
FIG. 4 is a schematic diagram of a system which includes a serial interface and a provision for programming an analog NVM.

FIG. 4 shows one embodiment of the invention, a serial interface for an analog non-volatile memory (ANVM). Input pin VPP 130 connects to the input of a level shifter 210. The level shifter creates the logic level signal, VPPL 220. SDA 110 is a logic level signal connected to an input of the Bus Interface Logic block 140 and, together with VPPL 220, provides the Data 160, Control 150 and synchronization of the serial interface. There is a set of analog outputs 440 produced by the NVM 170. The outputs may be used by other circuits on the same integrated circuit substrate or may be connected to bonding pads for connection to other parts of the system. The Mux block 430 is a multiplexer comprising a set of analog switches that connects one of the analog outputs to the Aout pin 410. The analog output that is selected depends on the state of the Select signals 420 that may be generated by the Bus Interface block. If a valid select address is not present on the Select 420 signals, all analog switches with the multiplexer are off and the Aout 410 pin is in a high impedance condition.

Alternatively, the Select signals to the Mux block may be generated by an independent circuit located either on the same integrated circuit substrate or in a separate location to reduce die size and complexity.

Figure 5:
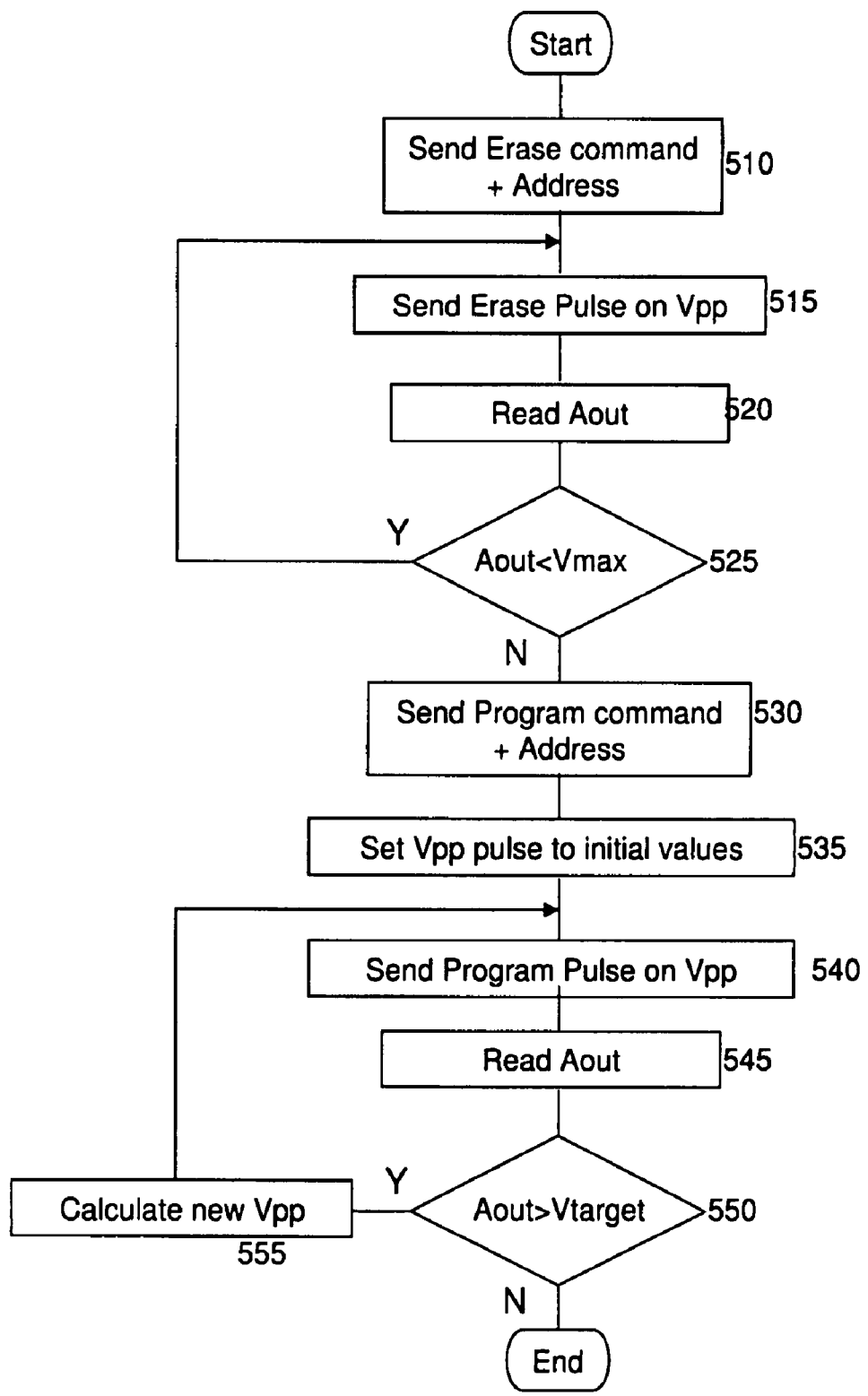
FIG. 5 is a flow chart of an analog write operation.

The serial interface shown in FIG. 4 allows the analog outputs generated within the NVM to be programmed by an external system. Consider an erase operation to increase the analog output and a program operation to decrease the output. An analog value is written by first fully erasing an output to a level significantly higher than the target voltage, say to a pre-determined voltage which corresponds to the maximum voltage of the storage dynamic range, Vmax. The output is then programmed in one or more controlled voltage steps until the output reaches the target value, Vtarget. The writing procedure is illustrated by the flow chart shown in FIG. 5.

The analog output, which is desired to be re-written, is prepared to be erased by Send Erase command+Address 510. A high voltage pulse is then transmitted on Vpp (Send Erase on Vpp) 515. The addressed analog storage cell in the ANVM is erased by Vpp and the resulting analog voltage read at the Aout terminal (Read Aout) when Vpp returns to a low voltage 520. If Aout≦(is less than) Vmax 525, in other words, if the analog output has not been sufficiently erased so as to be above the maximum voltage of the storage dynamic range, the erase is repeated by sending another pulse on Vpp. The sequence is repeated until Aout is equal to or greater than Vmax. The erase procedure can be completed by a single Vpp pulse if the pulse is of sufficient voltage amplitude and of sufficient duration. The programming sequence is started by Send Program command+Address for the desired analog output 530. Set Vpp pulse to initial values is transmitted on the Vpp signal 535. The parameters of a program pulse 535, or Send Program Pulse on Vpp 540, such as rise time, voltage amplitude and pulse duration, may be default values or may be calculated based on the difference between the measured voltage on Aout and Vtarget. After programming Read Aout 545 by measuring the voltage of the addressed analog output at the Aout pin after Vpp returns to a low level. If Aout≧(is greater than) Vtarget 550, Calculate new Vpp 555 and the program sequence is repeated until Aout is less than or equal to Vtarget. For improved precision and faster convergence the Vpp levels can begin at relatively high voltage and wide pulse widths and reduce to lower voltages and/or reduced pulse widths as Aout approaches Vtarget.

The writing method may be modified in several ways without departing from the spirit of the invention. An analog value may first be fully programmed and then erased in controlled increments or steps. Alternatively, the value may be adjusted simply by well-controlled erase or program pulses. Yet another alternative is to provide pulses of fixed characteristics or a D.C. level and perform pulse shaping with on-chip circuits. In such cases, the present invention allows the combination of digital control, high voltage programming and the reading of analog voltages along a serial bus.

Figure 6:
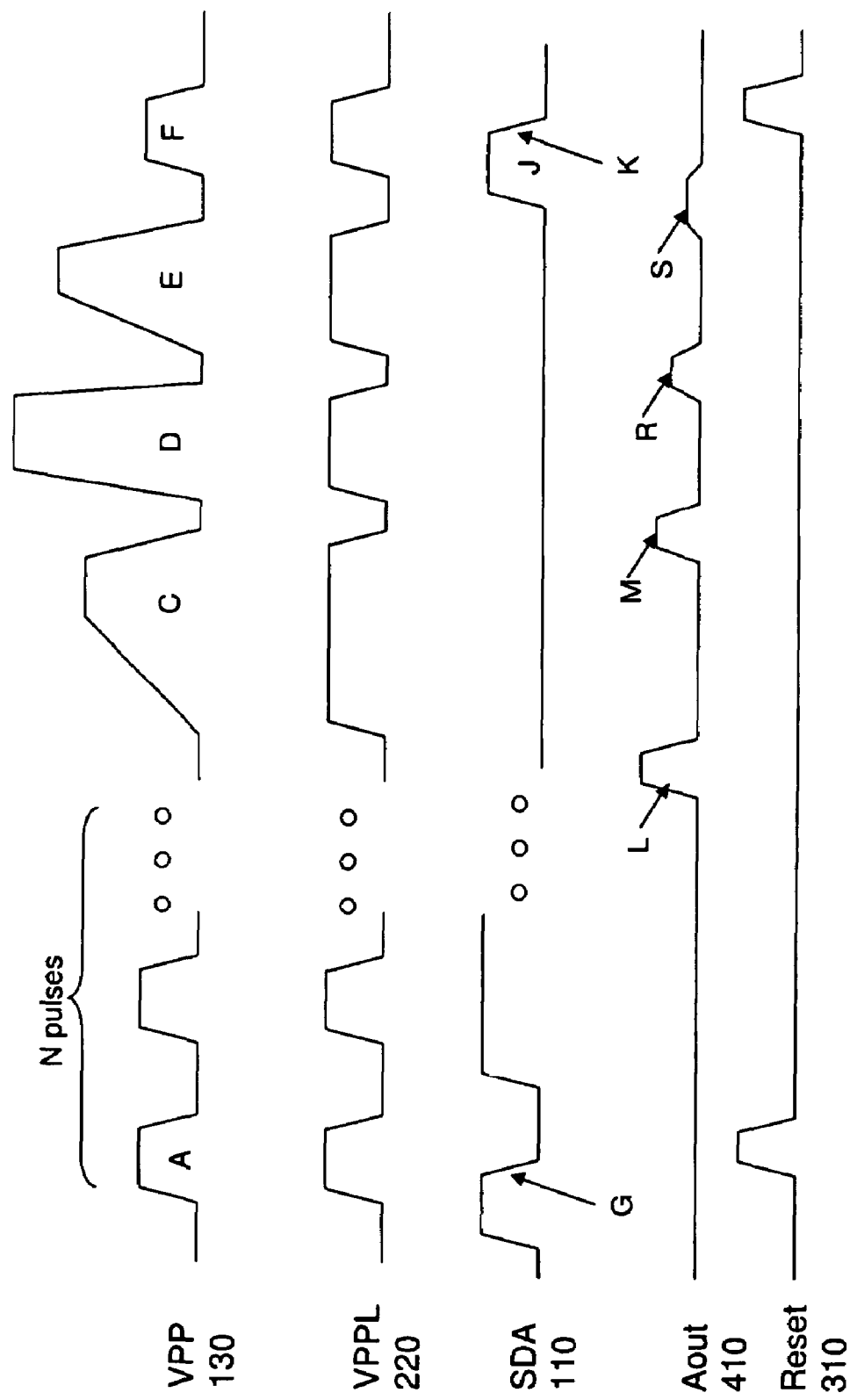
FIG. 6 is a diagram of voltage waveforms applied to SDA and VPP pins for programming analog values.

FIG. 6 shows an example of the voltage waveforms that would be used to program an analog voltage assuming that the desired analog output has already been erased to a high voltage, for instance by the sequence illustrated in FIG. 3. The first N pulses on Vpp clock the program instruction and the address of the analog output to be selected. After the address is accepted the selected analog output is connected to Aout. Pulse L on Aout has a voltage corresponding to the erased level of the addressed analog output. The next Vpp pulse, C, programs the analog output by an amount that depends on the parameters of pulse C. The resulting analog output voltage, M, appears on Aout when Vpp returns to a low level. Succeeding high voltage pulses, D and E, further program the analog output and the resulting voltages R and S are present on Aout. The sequence may be terminated by a RESET, as produced by the falling edge, K, of pulse J while Vpp is high (pulse F).

Figure 7:
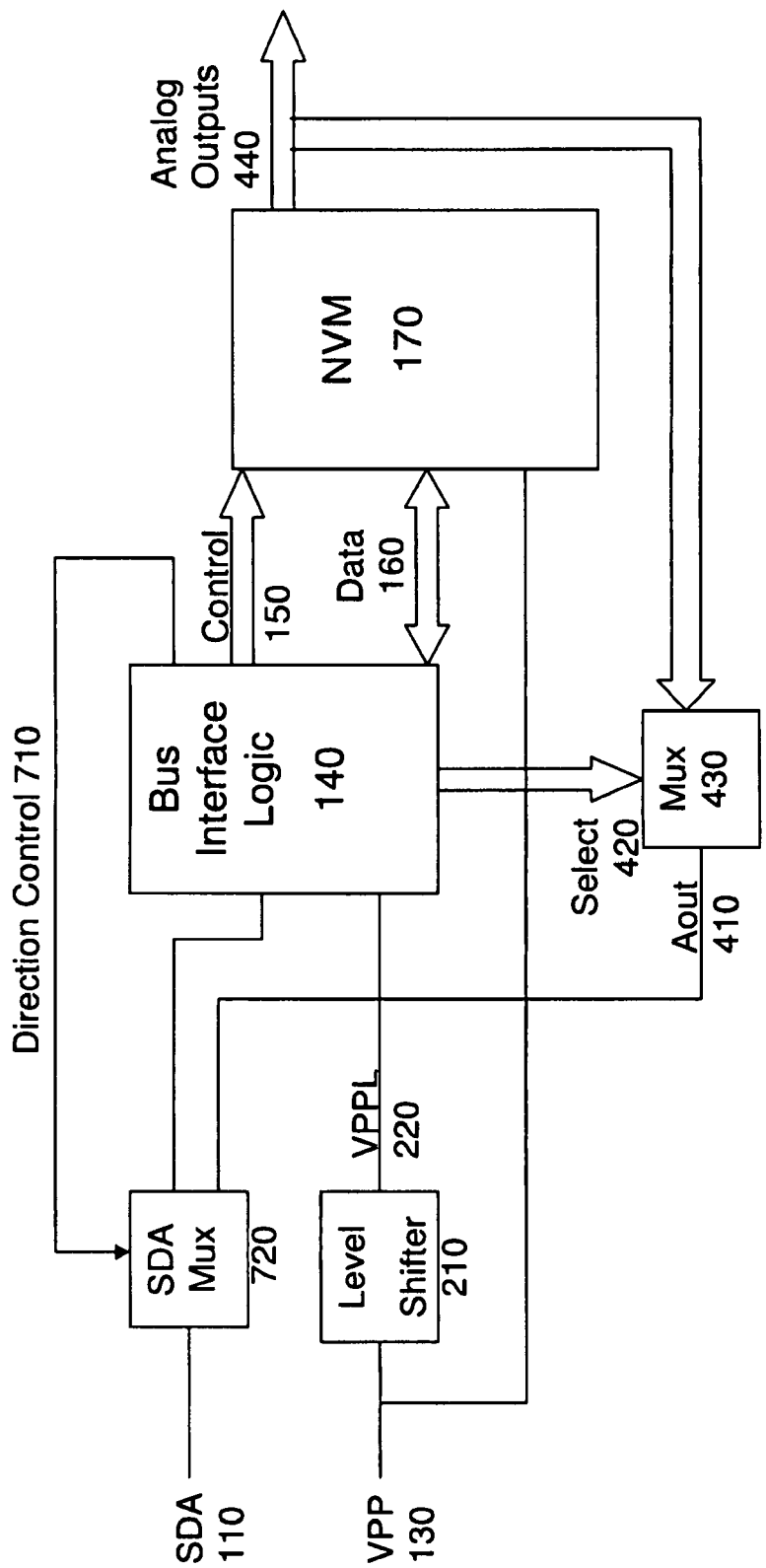
FIG. 7 is a schematic diagram of a system which includes an alternative interface to a programmable analog NVM.

A further embodiment is shown in FIG. 7. Input pin VPP 130 connects to the input of a level shifter 210. The level shifter creates the logic level signal, VPPL 220. SDA 110 is a logic level signal connected to an input of the Bus Interface Logic block 140 and, together with VPPL 220, provides the Data 160, Control 150 and synchronization of the serial interface. There is a set of analog outputs 440 produced by the NVM 170. The analog output that is selected depends on the state of the Select signals 420 that may be generated by the Bus Interface block. A multiplexer 720 connects the signal Aout 410 onto the SDA 110 pin, under control of the Bus Interface 140 block. At the end of a serial communication, say at the end of the Nth pulse, the SDA 110 signal that was previously being driven by the serial bus controller becomes high impedance at the bus controller output. The SDA 110 line is now available to transmit another signal. The Bus Interface 140 block changes the state of the Direction Control signal 710 for the SDA multiplexer 720 at the end of the Nth pulse and the Aout 410 signal is transferred onto the SDA 110 line. The Aout 410 signal is now transmitted along the serial bus without need of a separate Aout line. The two-wire serial bus now transmits digital control and address information, high voltage erase and program pulses and analog read voltages.

Foregoing described embodiments of the invention are provided as illustrations and descriptions. They are not intended to limit the invention to precise form described. In particular, it is contemplated that functional implementation of invention described herein may be implemented equivalently in hardware, software, firmware, and/or other available functional components or building blocks. Other variations and embodiments are possible in light of above teachings, and it is thus intended that the scope of invention not be limited by this Detailed Description, but rather by Claims following.

What we claim is:

1. A serial interface apparatus comprising:
   a first and second input;
   the second input comprising a logic level signal and a non-logic level signal coupling to the input of a level shifter; and
   the second input also coupling to a location requiring a non-logic level signal;
   wherein the non-logic level signal comprises a voltage different from a logic level signal;
   wherein on the second input, a first part of communication comprises one or more logic level pulses, and a second part of communication comprises one or more non-logic level pulses;
   wherein on the second input, the non-logic level signal and the logic level signal provide different functions.

2. The serial interface of claim 1 wherein the logic level signal is either a clock or a serial data signal, and the non-logic signal is capable of performing a write operation in a non-volatile memory.

3. The serial interface of claim 1 wherein the serial interface comprises a bus interface logic for providing logic level data, control, and synchronization to the location requiring the voltage different from that of the logic level.

4. The serial interface of claim 3 wherein the first input couples directly to the bus interface logic.

5. The serial interface of claim 1, wherein the location requiring the voltage different from that of the logic level comprises a memory, a device, a peripheral, a card, a cable or a display.

6. A method for combining logic level signals with non-logic level signals in a serial interface comprising the steps:
   sending a first logic level signal on a first input;
   sending a non-logic level signal and a second logic level signal on a second input; and
   converting the non-logic level and the second logic signal on the second input to a third logic level signal using a level shifter;
   combining the first logic level signal and the third logic level signal in bus interface logic, wherein the non-logic level signal comprises a voltage different from a logic level;

wherein on the second input, a first part of communication comprises one or more logic level pulses, and a second part of communication comprises one or more non-logic level pulses;

wherein the first logic level signal, the second logic level signal and the non-logic level signal provide different functions.

7. The method of claim 6 wherein a bus interface logic using the first and second logic level signals provides data to and controls a location requiring a non-logic level signal.

8. The method of claim 6 wherein the location requiring a non-logic level signal comprises a memory, a device, a peripheral, a card, a cable or a display.

9. The method of claim 6 wherein the first logic level signal is either a clock or a serial data signal, and the second logic level signal is the other signal, and the non-logic signal is capable of performing a write operation in a non-volatile memory.

10. A method of serial communication comprising the steps:

converting a non-logic level signal to a logic level signal using a level shifter producing a logic level reset signal;

sending logic level input data; and sending one or more non-logic level voltage pulses on either a logic level clock input or a logic level serial data input to a location requiring the non-logic level voltage;

wherein the logic level signal is a two level logic signal.

11. The method of claim 10 wherein one or more non-logic level voltage pulses are used to program or erase one or more bits.

12. The method of claim 10 wherein the location requiring the non-logic level voltage comprises a non-volatile memory.

13. The method of claim 12 wherein the non-volatile memory is implemented using Fowler-Nordheim tunneling, Channel Hot Electron injection, or a combination thereof.

14. The method of claim 10 wherein the non-logic level voltage pulses are followed by sending a reset signal.

15. A serial interface for an analog non-volatile memory apparatus comprising:

a first and second input;

the second input comprising a logic level signal and a non-logic level signal coupling to the input of a level shifter; and the second input also coupling to a location requiring a voltage different from a logic level;

wherein on the second input, a first part of communication comprises one or more logic level pulses, and a second part of communication comprises one or more non-logic level pulses;

wherein on the second input, the non-logic level signal and the logic level signal provide different functions.

16. The serial interface of claim 15 wherein the serial interface comprises a bus interface logic which controls and provides data to the analog non-volatile memory apparatus.

17. The serial interface of claim 15 wherein the non-volatile memory produces a set of one or more analog outputs.

18. The serial interface of claim 17 wherein the analog outputs can be read, erased, and programmed by an external system.

19. The serial interface of claim 17 wherein the analog outputs are coupled to a multiplexer coupling one of the analog outputs to an output pin.

20. The serial interface of claim 19 wherein the bus interface logic generates a signal that determines the output signal sent to the output pin.

21. The serial interface of claim 18 wherein the external system uses one or more high voltage pulses to erase and program the analog outputs.

22. The serial interface of claim 17 wherein the analog outputs are coupled to a multiplexer coupling one of analog outputs to a second multiplexer under control of the interface and the second multiplexer is coupled to the first input such that when a direction control signal changes state, a selected analog output from the analog outputs is transferred onto the first input.

23. A method of serial communication to program or erase an analog output of a non-volatile memory comprising the steps:

converting a non-logic level signal to a logic level signal using a level shifter;

producing a logic level reset signal;

sending logic level input data; and sending one or more non-logic level voltage pulses on either a logic level clock input or a logic level serial data input to a location requiring the non-logic level voltage;

wherein the logic level signal is a two level logic signal.

24. The method of claim 23 wherein the non-logic level voltage pulses are followed by sending a reset signal.

25. The method of claim 23 wherein the clock input or the data input coupling to the level shifter converts the non-logic voltage signal to a logic level signal for a bus interface logic which provides the data to and controls the analog output of the non-volatile memory.

26. A two wire serial interface bus comprising:

a first wire and a second wire;

the first wire comprises a first logic level signal; and the second wire comprises a non-logic level signal, and a second logic level signal, wherein the second wire is coupled to a level shifter and is also coupled to a location requiring a non-logic level signal; and a bus interface logic whose inputs are coupled from the output of the level shifter and from the first wire, the bus interface logic provides data and control information;

wherein on the second input, a first part of communication comprises one or more logic level pulses, and a second part of communication comprises one or more non-logic level pulses;

wherein the first logic level signal is either a clock signal or a serial data signal and the second logic level signal is the other signal;

wherein the non-logic level signal is capable of performing a write operation in a non-volatile memory.

\* \* \* \* \*